(12) United States Patent
Zommer

(10) Patent No.: US 9,082,879 B2
(45) Date of Patent: Jul. 14, 2015

(54) SILVER-TO-SILVER BONDED IC PACKAGE HAVING TWO CERAMIC SUBSTRATES EXPOSED ON THE OUTSIDE OF THE PACKAGE

(71) Applicant: IXYS Corporation, Milpitas, CA (US)

(72) Inventor: Nathan Zommer, Fort Lauderdale, FL (US)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 14/622,869

(22) Filed: Feb. 15, 2015

(65) Prior Publication Data

US 2015/0162304 A1 Jun. 11, 2015

Related U.S. Application Data

(63) Continuation of application No. 14/144,587, filed on Dec. 31, 2013, now Pat. No. 8,987,911.

(60) Provisional application No. 61/748,025, filed on Dec. 31, 2012.

(51) Int. Cl.
*H01L 21/00* (2006.01)
*H01L 23/00* (2006.01)
*H01L 21/56* (2006.01)
*H01L 21/78* (2006.01)
*H01L 23/373* (2006.01)

(52) U.S. Cl.
CPC ............ *H01L 24/83* (2013.01); *H01L 21/56* (2013.01); *H01L 21/78* (2013.01); *H01L 24/27* (2013.01); *H01L 24/32* (2013.01); *H01L 23/3735* (2013.01); *H01L 2224/05124* (2013.01); *H01L 2224/2745* (2013.01); *H01L 2224/27312* (2013.01); *H01L 2224/29139* (2013.01); *H01L 2224/32227* (2013.01); *H01L 2224/33181* (2013.01); *H01L 2224/8084* (2013.01); *H01L 2224/80895* (2013.01); *H01L 2924/01013* (2013.01); *H01L 2924/01029* (2013.01); *H01L 2924/05432* (2013.01); *H01L 2924/20107* (2013.01)

(58) Field of Classification Search
CPC .............. H01L 24/83; H01L 23/3735; H01L 2224/05124
USPC .......... 257/762, 772; 438/118, 644, 654, 686, 438/688
See application file for complete search history.

(56) References Cited

U.S. PATENT DOCUMENTS 5,759,960 A 6/1998 Ackermann et al. .......... 505/163

(Continued)

*Primary Examiner* — Nicholas Tobergte
(74) *Attorney, Agent, or Firm* — Imperium Patent Works; Amir V. Adibi

(57) ABSTRACT

A packaged power device involves no soft solder and no wire bonds. The direct-bonded metal layers of two direct metal bonded ceramic substrate assemblies, such as Direct Bonded Aluminum (DBA) substrates, are provided with sintered silver pads. Silver nanoparticle paste is applied to pads on the frontside of a die and the paste is sintered to form silver pads. Silver formed by an evaporative process covers the backside of the die. The die is pressed between the two DBAs such that direct silver-to-silver bonds are formed between sintered silver pads on the frontside of the die and corresponding sintered silver pads of one of the DBAs, and such that a direct silver-to-silver bond is formed between the backside silver of the die and a sintered silver pad of the other DBA. After leadforming, leadtrimming and encapsulation, the finished device has exposed ceramic of both DBAs on outside package surfaces.

20 Claims, 6 Drawing Sheets

(56) References Cited

U.S. PATENT DOCUMENTS

| | | | |
|---|---|---|---|
| 8,586,480 B1 | 11/2013 | Zommer | 438/686 |
| 8,716,864 B2 | 5/2014 | Zommer | 257/765 |
| 8,822,036 B1 | 9/2014 | Wereszczak | 428/609 |
| 2006/0220216 A1 | 10/2006 | Mizuno et al. | 257/691 |
| 2011/0075451 A1 | 3/2011 | Bayerer et al. | 363/37 |
| 2013/0020694 A1 | 1/2013 | Liang et al. | 257/691 |
| 2013/0049204 A1 | 2/2013 | Oeschler et al. | 257/772 |
| 2014/0225267 A1 | 8/2014 | Zommer | 257/762 |

WAFER
(TOP-DOWN VIEW)

ONE DIE AREA ON THE WAFER
(CROSS-SECTIONAL VIEW)

APPLY SILVER NANOPARTICLE
PASTE TO ALUMINUM PADS ON
THE FRONTSIDE OF WAFER
(CROSS-SECTIONAL VIEW)

WAFER AFTER APPLICATION OF
SILVER NANOPARTICLE PASTE
(TOP-DOWN VIEW)

| CONSTITUENT | | WEIGHT PERCENT |
|---|---|---|
| SILVER NANOPARTICLES | SILVER<br>~ 8-12 nm DIAMETER<br>SINTER TEMP = 250°C w/ no pressure | 86% |
| DISPERSANT / BINDER | FATTY ACID SUCH AS STEARIC ACID<br>BURNOUT TEMP = 200°C | 2% |
| SOLVENT (THINNER) | TERPINEOL | 10% |
| FLUX | A SALT OF A FLUORINE-CONTAINING ACID SUCH AS HEXAFLUOROSILIC ACID | 2% |

CONSTITUENTS OF THE SILVER NANOPARTICLE PASTE APPLIED TO THE INTEGRATED CIRCUITS

FIG. 6

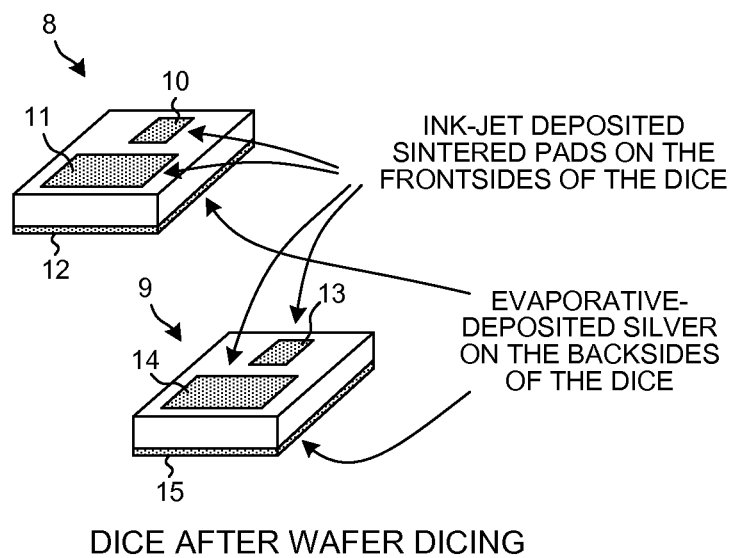

DICE AFTER WAFER DICING

FIG. 7

SINTERED SILVER PADS ON METAL ISLANDS OF
THE FIRST AND SECOND DBAS

DIE ATTACH TO THE DBAS USING
SOLDERLESS SILVER-TO-SILVER BONDING

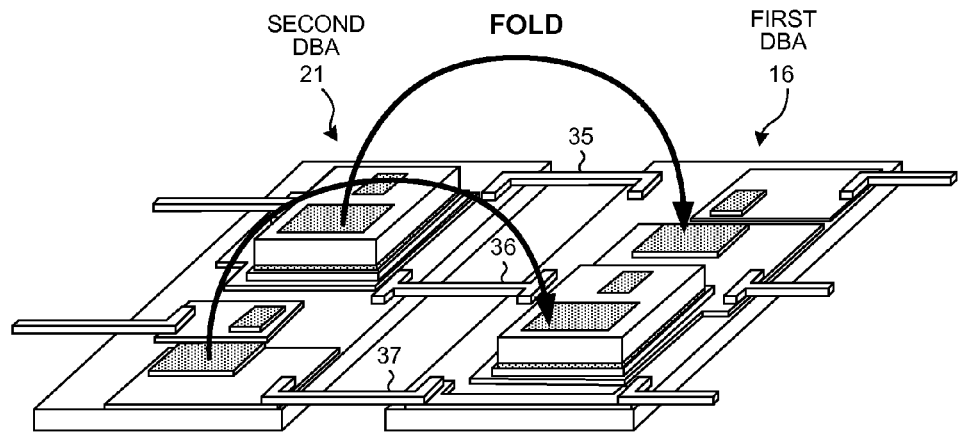
FOLD SO THAT SINTERED SILVER PADS ON THE FRONTSIDES OF THE DICE CONTACT SINTERED SILVER PADS OF THE DBAS
FIG. 10
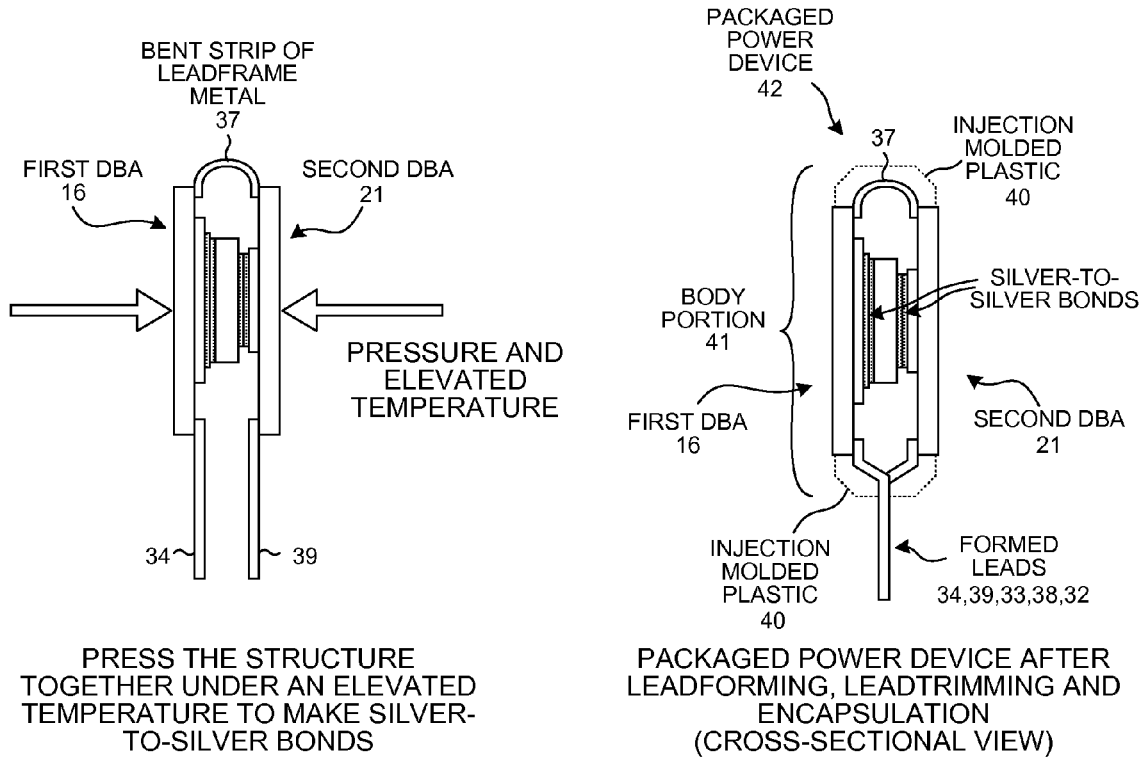
PRESS THE STRUCTURE TOGETHER UNDER AN ELEVATED TEMPERATURE TO MAKE SILVER-TO-SILVER BONDS
FIG. 11
PACKAGED POWER DEVICE AFTER LEADFORMING, LEADTRIMMING AND ENCAPSULATION
(CROSS-SECTIONAL VIEW)
FIG. 12

CIRCUIT DIAGRAM

PACKAGED POWER DEVICE WITH
TWO EXPOSED HEATSINK DBAS
(PERSPECTIVE VIEW)

SILVER-TO-SILVER BONDED IC PACKAGE HAVING TWO CERAMIC SUBSTRATES EXPOSED ON THE OUTSIDE OF THE PACKAGE

CROSS REFERENCE TO RELATED APPLICATIONS

This application is a continuation of, and claims priority under 35 U.S.C. §120 from, nonprovisional U.S. patent application Ser. No. 14/144,587 entitled "Silver-to-Silver Bonded IC Package Having Two Ceramic Substrates Exposed on the Outside of the Package," now U.S. Pat. No. 8,987,911, filed on Dec. 31, 2013, the subject matter of which is incorporated herein by reference. Application Ser. No. 14/144,587, in turn, claims priority under 35 U.S.C. §119 from U.S. Provisional Application No. 61/748,025, entitled "Silver-To-Silver Bonded IC Package Having Two Ceramic Substrates Exposed On The Outside Of The Package," filed on Dec. 31, 2012, the subject matter of which is incorporated herein by reference.

TECHNICAL FIELD

The described embodiments relate to integrated circuit packaging for power devices.

BACKGROUND INFORMATION

A type of integrated circuit package is known that involves a power integrated circuit die or dice sandwiched between the inner surfaces of two opposing parallel-oriented Direct Bonded Copper (DBC) substrates. U.S. Pat. Nos. 6,812,533 and 7,697,303 and U.S. Patent Publication 2012/0314372 set forth examples of packages in which a power integrated circuit die is sandwiched between two such ceramic substrate members. Stamped metal leads of the package extend from between the two substrate members. An improved integrated circuit package is sought.

SUMMARY

A packaged power device involves no soft solder, nor does it involve any wire bonds. A direct metal bonded ceramic substrate, such as a Direct Bonded Aluminum (DBA) substrate, has islands of metal that are direct-bonded to a ceramic substrate. The islands of two such DBAs are provided with sintered silver pads. The two DBAs are attached to a leadframe by ultrasonic welding.

Silver nanoparticle paste is applied to aluminum bond pads on the frontside (i.e., device side) of a die and the paste is sintered so that the aluminum bond pads on the front side of the die are covered with sintered silver pads. Special nanoparticle paste may be used that penetrates a thin native oxide present on the aluminum bond pads during sintering such that good mechanical and electrical contact is made between the sintered silver structure and the underlying aluminum pad. Silver formed by an evaporative process covers the entire backside of the die.

Multiple such dice are placed onto the DBAs such that silver on the backside of each die is in contact with a corresponding sintered silver pad of a DBA. The resulting assembly is then folded so that the leadframe bends, and so that the dice are pressed between the two DBAs. For each die of the assembly, the pressing causes a direct silver-to-silver bond to be formed between the evaporative silver on the backside of the die and a corresponding sintered silver pad of one of the DBAs, and such that direct silver-to-silver bonds are formed between sintered silver pads on the frontside of the die and corresponding sintered silver pads of the other DBA. Alternatively, the dice can be attached so that their silvered backsides are attached to their respective DBA in a first step, and then the assembly is folded in a second step, and then pressure is applied to attach the sintered silver pads on the frontsides of the dice to their corresponding BDAs in a third step.

The resulting folded structure is then encapsulated with an amount of injection molded encapsulant so that a body portion of the packaged power device is formed. Leadforming and leadtrimming are carried out to form a single row of in-line package terminals that extends from one side of the body portion of the package. The finished packaged power device has exposed ceramic of both DBAs on outside surfaces of the body portion of the package. In one example, the packaged power device has no soft solder, nor does it have any bond wires.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 6 is a table that sets forth the constituents of the silver nanoparticle paste applied to the wafer, in one specific exemplary embodiment.

FIG. 7 is a perspective diagram of two of the dice that are formed by dicing the wafer of FIG. 5.

FIG. 10 is a perspective diagram that shows the structure of FIG. 9 being folded so that the sintered silver pads on the frontsides of the dice can be direct silver-to-silver bonded to corresponding sintered silver pads on the islands of the DBAs.

FIG. 11 is a cross-sectional diagram that illustrates how the folded structure of FIG. 10 is pressed together under adequate pressure and temperature, and for an adequate amount of time, such that direct silver-to-silver bonds are formed between the sintered silver pads on the frontsides of the dice and corresponding sintered silver pads of the DBAs.

FIG. 12 is a cross-sectional diagram that shows the packaged power device after leadforming, leadtrimming and encapsulation.

DETAILED DESCRIPTION

Reference will now be made in detail to some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "front", "back", "top" and "bottom" and similar terms are used herein to describe relative orientations between different parts of the structure being described, and it is to be understood that the overall structure being described can actually be oriented in any way in three-dimensional space.

Figure 1:
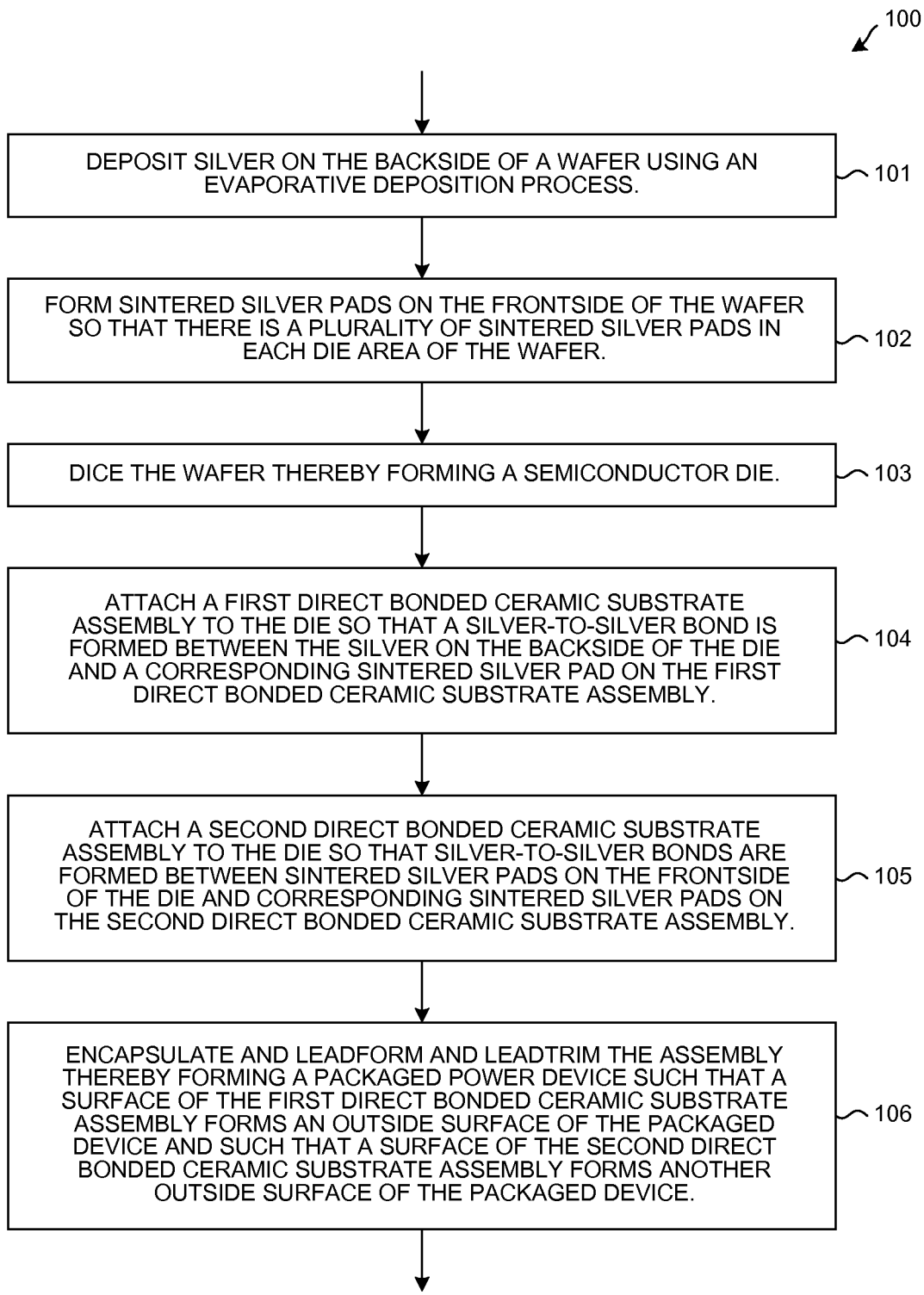
FIG. 1 is a flowchart of a method in accordance with one novel aspect.
Figure 2:
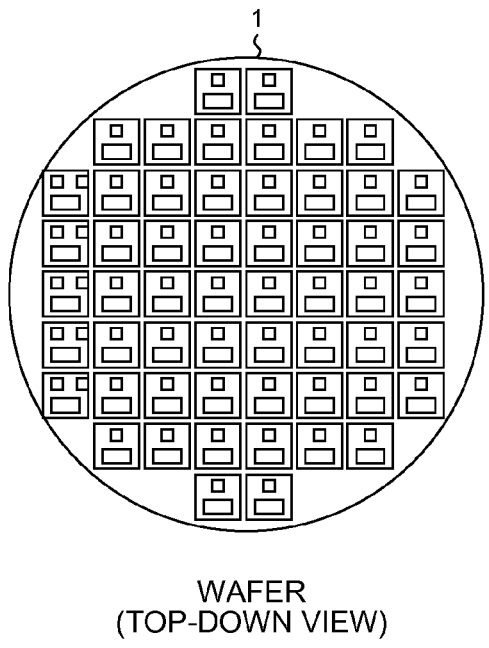
FIG. 2 is a top-down perspective view of a wafer of power devices.
Figure 3:
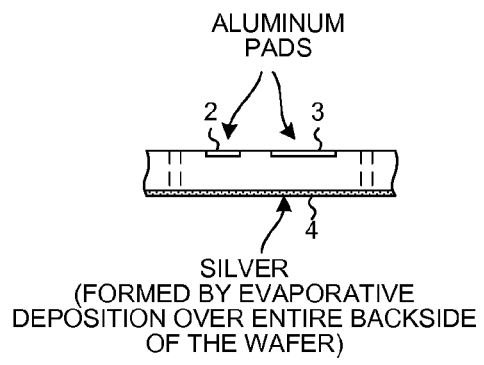
FIG. 3 is a partial cross-sectional diagram of one die area of the wafer of FIG. 2.

FIG. 1 is a flowchart of a method 100 in accordance with one novel aspect. Silver is deposited (step 101) on the backside of a wafer using an evaporative deposition process. Silver covers the entire backside of the wafer or substantially all of the backside of the wafer. FIG. 2 is a top-down diagram of the wafer 1. FIG. 3 is a cross-sectional side view of one die area of the wafer of FIG. 2. In the present example, each die area includes a transistor, such as an Insulated Gate Bipolar Transistor (IGBT). Aluminum pads 2 and 3 are disposed on the frontside of die area. Aluminum contact pad 2 is for connection to the gate of the transistor. Aluminum contact pad 3 is for connection to the emitter of the transistor. The silver 4 on the backside of the wafer is for contact to the collector of the transistor.

Figure 4:
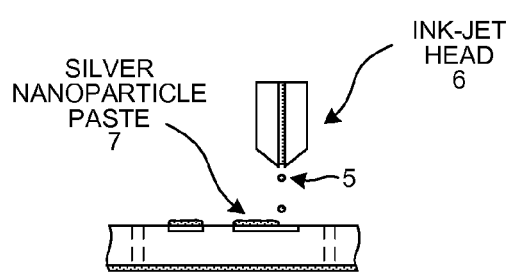
FIG. 4 is a partial cross-sectional diagram that illustrates an application of silver nanoparticle paste onto aluminum pads on the frontside of the die area of FIG. 3.

Sintered silver pads are formed on the frontside of the wafer so that there is a plurality of sintered silver pads in each die area of the wafer. FIG. 4 is a diagram that shows microdots 5 of silver nanoparticle paste 7 being ink-jet printed down onto the aluminum contact pads 2 and 3 on the frontside of the die area. The silver nanoparticle paste 7 is only applied to the aluminum contact pads and is not applied elsewhere on the frontside of the wafer. In the illustrated example, the printing is applied in a micro-jetting process that involves use of an ink-jet micronozzle head 6. The ink-jet micronozzle head is scanned back and forth across the wafer and the micronozzle is controlled to emit microdots of the silver nanoparticle paste onto only the aluminum contact pads. In another example, the printing is not an ink-jet printing process but rather is a screen printing process involving a stencil.

Figure 5:
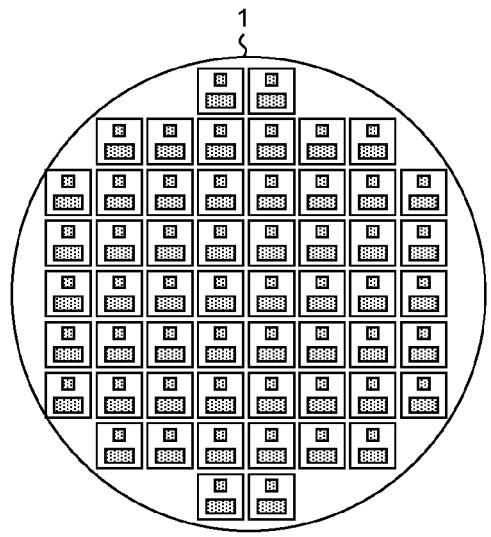
FIG. 5 is a top-down diagram of the wafer after application the silver nanoparticle paste.

FIG. 5 is a top-down diagram of the wafer 1 after application of the silver nanoparticle paste 7 to the aluminum pads on the frontside of the wafer. Each of the squares is the boundary of one of the die areas. The aluminum pads are illustrated as shaded to indicate that each aluminum pad is covered with silver nanoparticle paste.

FIG. 6 is a table that sets for the constituents of the silver nanoparticle paste 7 that is applied onto the aluminum pads, in one specific embodiment. For further details including details on the silver nanoparticle paste of FIG. 6, on other suitable sintering pastes involving silver particles, on related techniques, and on how to use such silver particle pastes in carrying out solderless die attach to a DBA, see: U.S. Pat. No. 8,716,864, entitled "Solderless Die Attach To A Direct Bonded Aluminum Substrate", filed Jun. 7, 2012 (the entire content of which is expressly incorporated herein by reference).

After application of the silver nanoparticle paste, the wafer 1 is heated so that the individual volumes of silver nanoparticle paste on the frontside of the wafer are sintered to form individual sintered silver structures. As the temperature increases to about 150° C., the thinner in the paste evaporates. This results in a somewhat more dense packing of the silver nanoparticles. Once the thinner has evaporated, the temperature is increased further to approximately 200° C. The type of dispersant/binder is selected so that the dispersant/binder coating separates from the silver particles and burns out at this 200° C. elevated temperature, but before actual sintering takes place at a higher sintering temperature of about 250° C. Generally the dispersant and the binder are organic molecules involving carbon chains of twelve or more carbon atoms, whereas the thinner is an organic molecule that has carbon chains of approximately three carbon atoms. Before burning off, these constituents and the flux particles in the paste decompose to form reactive compounds and acids. The flux particles are not active at room temperature, but under the elevated temperatures before burn off the flux particles decompose into compounds such as acids. These compounds attack and help penetrate any thin native aluminum oxide that is present on the aluminum pads. Pressure and ultrasonic energy can also be provided to promote cracking of the thin native aluminum oxide. Care is taken, however, not to be so aggressive that damage comes to the structure underlying the aluminum pads. Bonding between the silver nanoparticles and the exposed aluminum, and/or between the other constituents of the paste and the exposed aluminum, occurs in these cracks in the thin native oxide. As the temperature continues to increase, the dispersant/binder and flux residue are burned off or driven off as a consequence of the higher sintering temperatures at the end of the sintering process. In an example where no pressure is applied, sintering occurs at a temperature of 250° C. Alternatively, pressure-assisted sintering is used in combination with smaller silver particles so that sintering occurs at a lower temperature that is higher than 200° C. but lower than 250° C. After sintering, the frontside of the wafer is thoroughly cleaned to remove any flux residue that might still remain.

The cleaned wafer is then diced (step 103) thereby forming a plurality of semiconductor dice. FIG. 7 is a perspective diagram of two of the dice 8 and 9. First die 9 has two sintered silver contact pads 13 and 14 on its frontside and also has a layer 15 of silver on its backside. Second die 8 has two sintered silver contact pads 10 and 11 on its frontside and also has a layer 12 of silver on its backside.

A first direct metal bonded ceramic substrate assembly 16 has a plurality of islands 17-19 of aluminum. The islands of aluminum are direct bonded to a thicker ceramic substrate portion 20. Similarly, a second direct metal bonded ceramic substrate assembly 21 has a plurality of islands 22-24 of aluminum that are direct bonded to the ceramic substrate portion 25. The aluminum islands are made by pressing an aluminum plate onto a larger ceramic panel. The larger ceramic panel may, for example, be 5.6 inches wide by 7.7 inches long, and may be 0.63 mm thick. The aluminum plate may be 0.30 mm thick. After attachment of the aluminum plate to the ceramic substrate panel, the aluminum plate is patterned and etched to form the individual aluminum islands. All exposed aluminum surfaces are then cleaned (for example, using a strong alkaline solution of NaOG followed by a zinc-based treatment) and are immediately plated with a metal such as nickel or palladium. An electroplating process may be used. The resulting plating metal layers on the aluminum islands are about five microns thick. Alternatively, an electroless nickel plating process may be used in which case the nickel layer may include about eight percent phosphorous. Alternatively, an electroless palladium plating process may be used. Multiple layers of metal can be plated. The topmost metal plating layer is a metal that when silver nanoparticle paste is sintered upon it, forms a good bond with the sintered silver. For further details on the manufacture of direct metal bonded substrate assemblies, see: U.S. Pat. No. 6,798,060, U.S. Pat. No. 7,005,734, and U.S. Pat. No. 6,404,065 (the subject matter of which is incorporated herein by reference).

Silver nanoparticle paste is then applied onto selected areas of these metal-plated aluminum islands. Where the metal onto which the silver nanoparticle paste is applied is palladium, the silver nanoparticle paste may be mAgic Paste Microbond paste, series ASP016, ASP043, ASP131 or APA859, that is commercially available from Heraeus Materials Technology GmbH & Co. KG of Hanau, Germany. A screen printing process using a patterned screen and a wiper may be used. The silver nanoparticle paste on the aluminum islands of the DBAs 16 and 21 is then sintered to form the silver pads 26-31.

Figure 8:
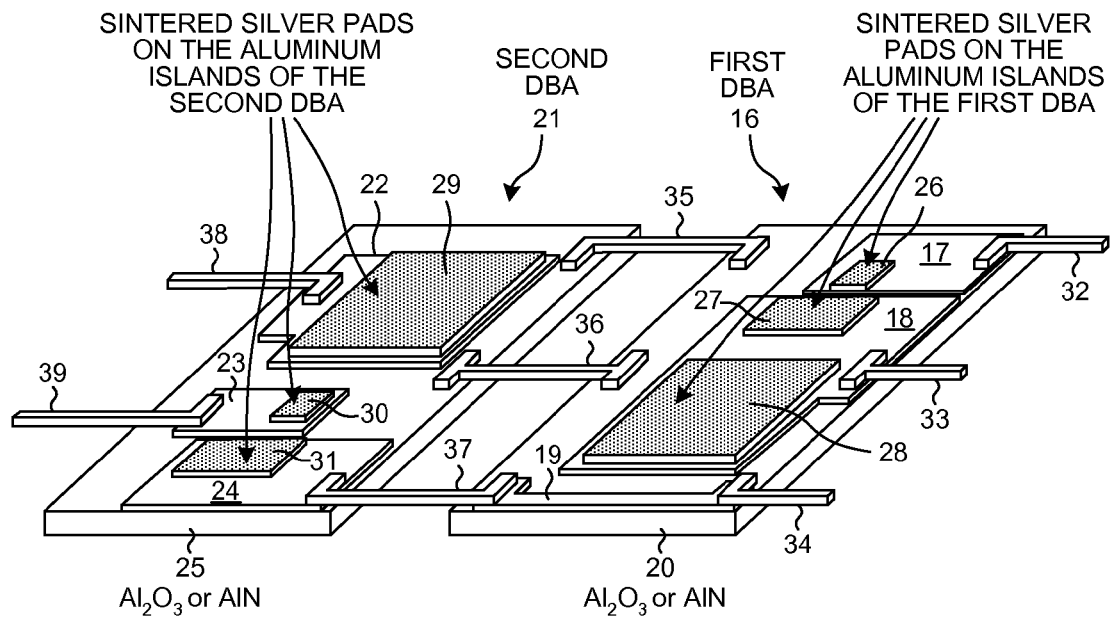
FIG. 8 is a perspective diagram of two Direct Bonded Aluminum (DBA) substrate assemblies that are interconnected by metal of a leadframe, where sintered silver pads are provided on the aluminum islands of the DBAs.

Once the metallization steps are completed, the panel is singulated to form the first and second direct metal bonded ceramic substrate assemblies 16 and 21. The first and second direct metal bonded ceramic substrate assemblies 16 and 21 in this case are Direct Bonded Aluminum (DBA) substrate assemblies, but in other embodiments the direct metal bonded substrate assemblies 16 and 21 may be Direct Bonded Copper (DBC) substrate assemblies. A stamped metal leadframe is ultrasonically welded to the DBAs 16 and 21 so that portions 32-39 of metal connects the two DBA assemblies 16 and 21 together. The diagram of FIG. 8 is a simplification in this regard. At this point in the process, the leads of the metal leadframe have not yet been separated nor have they been leadformed, but rather the strips of bridging metal and the metal leads shown in FIG. 8 are still parts of a single leadframe.

Figure 9:
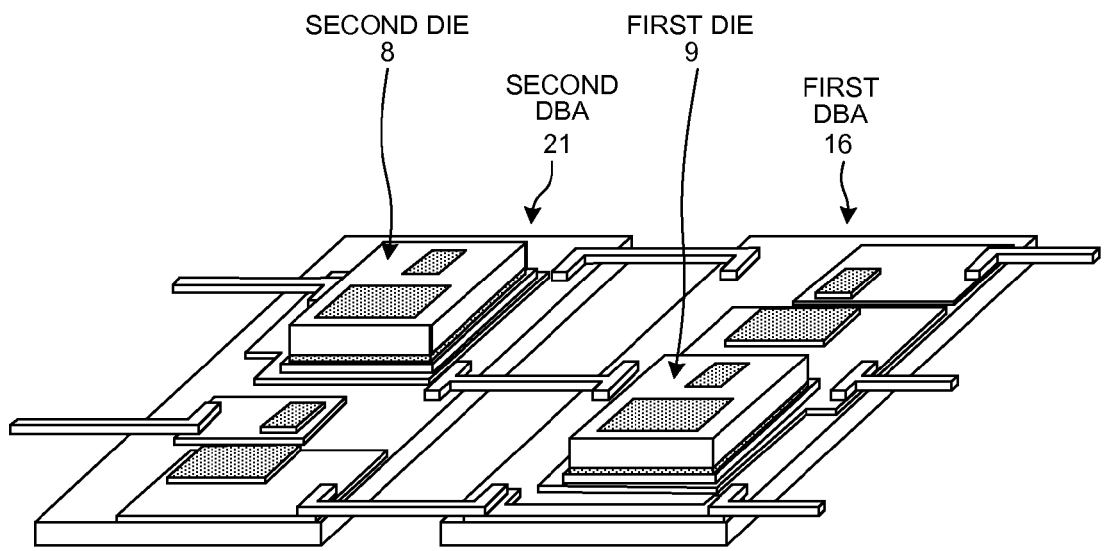
FIG. 9 is a perspective diagram that illustrates the attaching of the two dice of FIG. 7 to the two DBAs of FIG. 8 using solderless silver-to-silver bonding.

Next, the first direct metal bonded ceramic substrate assembly 16 is bonded (step 104) to the first die 9 so that a direct silver-to-silver bond is formed between the silver 15 on the backside of the die 9 and the sintered silver pad 28 on the first direct metal bonded ceramic substrate assembly. The second direct metal bonded ceramic substrate assembly 21 is bonded to the second die 8 so that a direct silver-to-silver bond is formed between the silver 12 on the backside of the die 8 and the sintered silver pad 29 on the second direct metal bonded ceramic substrate assembly 21. To perform this die attach step, the dice 9 and 8 are placed down onto corresponding silver pads 28 and 29 of the direct metal bonded ceramic substrate assemblies, and the dice are pressed down under adequate pressure and temperature and held for a time such that the silver layers 15 and 12 on the backsides of the dice are direct silver-to-silver bonded to the sintered silver pads 28 and 29 (see FIG. 8) of the direct bonded ceramic substrate assemblies. FIG. 9 is a perspective diagram that shows the resulting structure with the dice 9 and 8 attached to the two DBAs 16 and 21, respectively.

Next, the second direct metal bonded ceramic substrate assembly 21 is bonded (step 105) to the first die 9 so that a silver-to-silver bonds are formed between sintered silver pads 13 and 14 on the frontside of the die 9 and corresponding sintered silver pads 30 and 31 on the second direct metal bonded ceramic substrate assembly 21. Similarly, the first direct metal bonded ceramic substrate assembly 16 is bonded to the die 8 so that a silver-to-silver bonds are formed between sintered silver pads 10 and 11 on the frontside of the second die 8 and corresponding sintered silver pads 26 and 27 on the first direct metal bonded ceramic substrate assembly 16. In one example, to perform this attaching step, the structure is folded as illustrated in FIG. 10, and is then pressed together under adequate pressure and temperature and held in this way for an adequate time as illustrated in FIG. 11 until the direct silver-to-silver bonds are formed. The pressure applied may be a weight of one kilogram applied per die (30 MPa), and the temperature may be 250° C., and the time may be two minutes. Due to the folding, each of the portions of metal 35, 36 and 37 becomes a bent strip of leadframe metal having on end attached to the first DBA 16 and having a second end attached to the second DBA 21.

The dice are encapsulated in an amount of injection molded encapsulant 40 so that a body portion 41 of a packaged power device 42 is formed. Leadforming and leadtrimming are then performed. Alternatively, the leadforming step can be performed before encapsulation, with the leadtrimming step following encapsulation. FIG. 12 is a cross-sectional diagram of the resulting packaged power device 42. The metal of the leadframe has been bent (formed) and then trimmed so that five, parallel-extending, single in-line terminals 34, 39, 33, 38 and 32 extend downward from the bottom side of the body portion 41. The three bent over strips 35, 36 and 37 of the leadframe metal are disposed entirely within the body portion 41 as illustrated.

Figure 13:
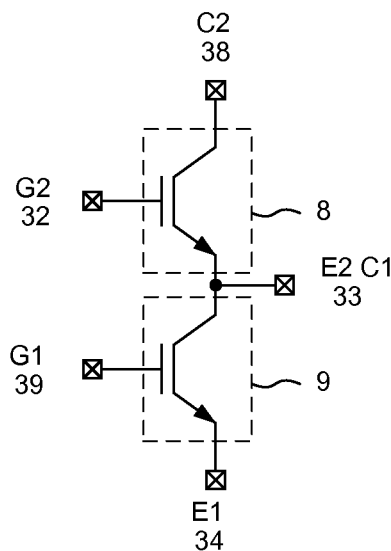
FIG. 13 is a circuit diagram of the packaged power device of FIG. 12.

FIG. 13 is a circuit diagram of the circuit of the packaged power device 42.

Figure 14:
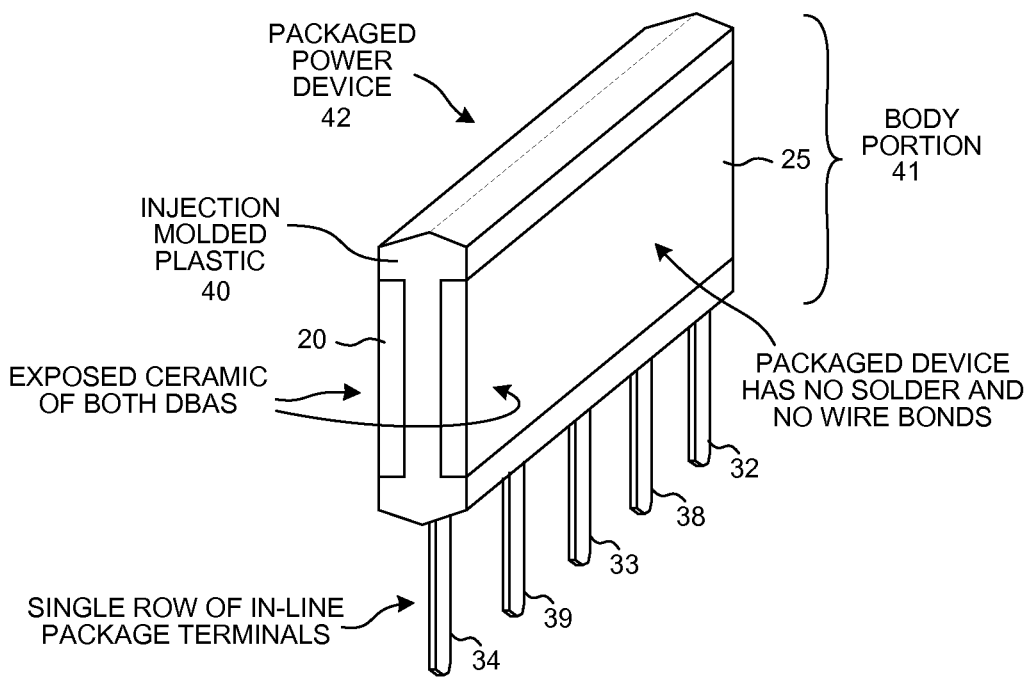
FIG. 14 is a perspective diagram of the packaged power device of FIG. 12.

FIG. 14 is a perspective diagram of the finished packaged power device 42. The finished packaged power device 42 has exposed ceramic of both DBAs 16 and 21 on outside surfaces of the body portion 41 of the package so that heat can be better dissipated through these major opposing outside ceramic surfaces of the body portion. There are no soft solder joints of any type within packaged power device 42, nor are there any bond wires in packaged power device 42. The metal of the terminals (leadframe metal) are ultrasonically welded to the DBAs without the use of any soft solder. The dice within the package are attached to the DBAs using direct solderless silver-to-silver bonds. Rather than DBA substrates, other types of direct bonded metal (DBM) substrates may be employed to realize the packaged power device structure of FIG. 14, such as for example DBC substrates. The metal of the islands as such DBM substrates may involve multiple layers of different metals.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method, comprising:
   (a) attaching a sintered silver pad of a first Direct Metal Bonded (DMB) ceramic substrate assembly to a layer of silver that covers a backside of a semiconductor die such that a silver-to-silver bond is formed between the first DMB ceramic substrate and the die, wherein the die comprises the layer of silver on the backside of the die, and wherein the die further comprises a plurality of sintered silver pads on a frontside of the die; and
   (b) attaching a plurality of sintered silver pads of a second DMB ceramic substrate assembly to the plurality of sintered silver pads on the frontside of the semiconductor die such that a plurality of silver-to-silver bonds is formed between the second DMB ceramic substrate assembly and the die.

2. The method of claim 1, further comprising:
(c) applying an amount of encapsulant to the first and second DMB ceramic substrate assemblies thereby forming a body portion of a package; and
(d) trimming a first plurality of leads attached to the first DMB ceramic assembly, and trimming a second plurality of leads attached to the second direct bonded ceramic assembly, such that the first and second pluralities of leads form a single in-line set of package terminals that extends from the body portion of the package.

3. The method of claim 2, wherein a surface of the first DMB ceramic substrate assembly is a first surface of the body portion, and wherein a surface of the second DMB ceramic substrate assembly is a second surface of the body portion.

4. The method of claim 1, wherein the forming of the silver-to-silver bond in (a) involves pressing the die and the first DMB ceramic substrate assembly together at an elevated temperature of at least 250 degrees Celsius, and wherein the forming of the silver-to-silver bonds in (b) involves pressing the die and the second DMB ceramic substrate assembly together at an elevated temperature of at least of at least 250 degrees Celsius.

5. The method of claim 1, further comprising:
(c) forming the semiconductor die, wherein the forming of (c) occurs before the attaching of (a) and occurs before the attaching of (b).

6. The method of claim 5, wherein the forming of the semiconductor die in (c) involves:
(c1) depositing a layer of silver onto an entire backside of a wafer using an evaporative deposition process;
(c2) after the depositing of (c1) printing silver nanoparticle paste onto selected portions of a frontside of the wafer;
(c3) sintering the silver nanoparticle paste on the frontside of the wafer thereby forming the plurality of sintered silver pads; and
(c4) dicing the wafer thereby forming the semiconductor die.

7. The method of claim 6, wherein the selected portions of the frontside of the wafer to which the silver nanoparticle paste is applied in (c2) are aluminum pads that are covered with thin layers of aluminum oxide.

8. The method of claim 1, wherein the first DMB ceramic substrate assembly is a Direct Bonded Copper (DBC) substrate assembly.

9. The method of claim 1, wherein the first DMB ceramic substrate assembly is a Direct Bonded Aluminum (DBA) substrate assembly.

10. The method of claim 1, further comprising:
(c) encapsulating the first and second DMB ceramic substrate assemblies to form a packaged power device such that a surface of the first DMB ceramic substrate forms an outside surface of the packaged power device and such that a surface of the second DMB ceramic substrate forms another outside surface of the packaged power device.

11. The method of claim 10, wherein the packaged power device comprises no soft solder and no bond wires.

12. The method of claim 1, further comprising:
(c) depositing the layer of silver on the backside of the semiconductor die using an evaporative deposition process, wherein the depositing of (c) occurs before the attaching of (a) and the attaching of (b).

13. The method of claim 1, further comprising:
(c) depositing a layer of silver on the backside of a semiconductor wafer using an evaporative deposition process;
(d) dicing the semiconductor wafer to form the semiconductor die, wherein the depositing of (c) and the dicing of (d) occur before the attaching of (a) and the attaching of (b).

14. The method of claim 1, further comprising:
(c) ink-jet printing silver nanoparticle paste onto selected portions of the frontside of the die; and
(d) sintering the silver nanoparticle paste on the frontside of the die to form the plurality of sintered silver pads, wherein the ink-jet printing of (c) and the sintering of (d) occur before the attaching of (a) and the attaching of (b).

15. The method of claim 1, wherein the semiconductor die further comprises a plurality of aluminum pads disposed on the frontside of the die, and wherein each of the plurality of sintered silver pads that is disposed on the frontside of the die is disposed on a corresponding one of the plurality of aluminum pads.

16. A method, comprising:
depositing a layer of silver onto a backside of a semiconductor die using an evaporative deposition process;
printing silver nanoparticle paste onto selected portions of a frontside of the semiconductor die;
sintering the silver nanoparticle paste on the frontside of the semiconductor die to form a plurality of sintered silver pads;
forming a silver-to-silver bond between a first Direct Metal Bonded (DMB) ceramic substrate and the semiconductor die by attaching a sintered silver pad of the first DMB ceramic substrate to the layer of silver on the backside of the semiconductor die; and
forming a plurality of silver-to-silver bonds between a second DMB ceramic substrate and the semiconductor die by attaching a plurality of sintered silver pads of the second DMB ceramic substrate to the plurality of sintered silver pads on the frontside of the semiconductor die.

17. The method of claim 16, further comprising:
encapsulating the first and second DMB ceramic substrates to form a packaged power device such that a surface of the first DMB ceramic substrate forms an outside surface of the packaged power device and such that a surface of the second DMB ceramic substrate forms another outside surface of the packaged power device.

18. The method of claim 17, wherein the packaged power device comprises no soft solder and no bond wires.

19. The method of claim 17, wherein a bent strip of lead-frame metal is disposed entirely within the packaged power device, wherein the bent strip has a first end that is welded to the first DBM ceramic substrate, and wherein the bent strip has a second end that is welded to the second DBM ceramic substrate.

20. The method of claim 16, further comprising:
ultrasonically welding metal package terminals to the first and second DMB ceramic substrates.

* * * * *